(12) United States Patent
Kim et al.

(10) Patent No.: US 7,902,006 B2
(45) Date of Patent: Mar. 8, 2011

(54) METHOD OF MANUFACTURING A THIN FILM TRANSISTOR ARRAY SUBSTRATE

(75) Inventors: Woong-Kwon Kim, Cheonan-si (KR);
Ho-Jun Lee, Anyang-si (KR);
Hong-Kee Chin, Suwon-si (KR);
Sang-Heon Song, Cheonan-si (KR);
Jung-Suk Bang, Guri-si (KR); Jun-Ho Song, Seongnam-si (KR); Byeong-Jae Ahn, Suwon-si (KR); Bae-Heuk Yim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 12/436,356

(22) Filed: May 6, 2009

(65) Prior Publication Data
US 2010/0159652 A1     Jun. 24, 2010

(30) Foreign Application Priority Data

Dec. 23, 2008    (KR) .......................... 10-2008-0132431

(51) Int. Cl.
*H01L 21/00*     (2006.01)
*H01L 21/84*     (2006.01)
*G02F 1/1343*     (2006.01)
*G02F 1/1333*     (2006.01)

(52) U.S. Cl. ............ 438/158; 349/38; 349/43; 349/110; 349/111; 257/E21.231; 257/E21.232; 257/E21.234; 257/E21.235

(58) Field of Classification Search .......... 438/149–166; 349/38, 42–47, 102–111
See application file for complete search history.

(56) References Cited

U.S. PATENT DOCUMENTS
2002/0021403 A1 *    2/2002    Kim et al. .................... 349/187

FOREIGN PATENT DOCUMENTS
GB     2396048    *    6/2004
GB     2396242    *    6/2004

* cited by examiner

*Primary Examiner* — Michael S Lebentritt
*Assistant Examiner* — Karen M Kusumakar
(74) *Attorney, Agent, or Firm* — Innovation Counsel LLP

(57) ABSTRACT

In manufacturing a thin film transistor array substrate, a passivation film is formed over the transistors. A first photoresist pattern is formed over the passivation film, with a first portion partially overlying at least one source/drain electrode of each transistor and overlying each pixel electrode region, and with a second portion thicker than the first portion. The passivation film is patterned using the first photoresist pattern as a mask. The first photoresist pattern's first portion is removed to form a second photoresist pattern which protrudes upward around the pixel electrode regions. A transparent conductive film is formed with recesses in the pixel electrode regions. A masking pattern is formed over the transparent film in each pixel electrode region, the masking pattern's top surface being below a top of the transparent film. The transparent film is patterned using the masking pattern as a mask to form the pixel electrodes.

17 Claims, 15 Drawing Sheets

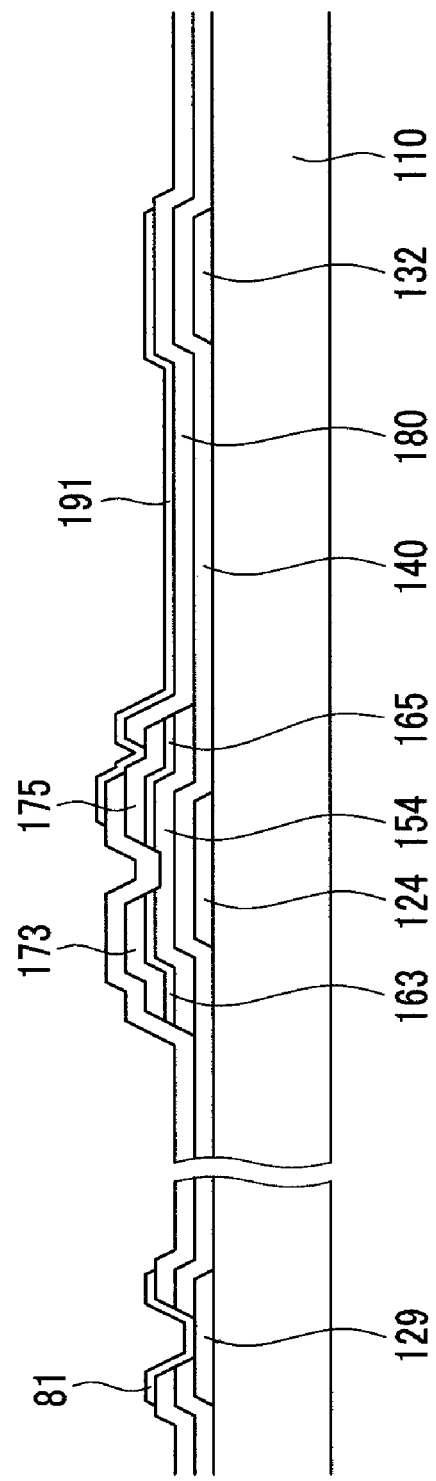

METHOD OF MANUFACTURING A THIN FILM TRANSISTOR ARRAY SUBSTRATE

CROSS-REFERENCE TO RELATED APPLICATION

This application claims priority to and the benefit of South Korean Patent Application No. 10-2008-0132431 filed in the Korean Intellectual Property Office on Dec. 23, 2008, the entire contents of which are incorporated herein by reference.

BACKGROUND OF THE INVENTION

1. Field of the Invention

The present invention relates to a method of manufacturing a thin film transistor array substrate. Some embodiments use a reduced number of mask processes.

2. Description of the Related Art

Thin film transistor array substrates are used in many display devices including for example liquid crystal displays. A liquid crystal display device displays an image by using an electric field to control optical properties of liquid crystal material. The liquid crystal display device includes a liquid crystal display panel which has liquid crystal cells arranged in a matrix. The liquid crystal panel is driven by a driving circuit.

The liquid crystal display panel includes a thin film transistor array substrate and a color filter array substrate facing each other. The liquid crystal material is located between the two substrates. A spacer is located between the two substrates to maintain a desired cell gap between the two substrates.

The thin film transistor array substrate includes gate lines and data lines, thin film transistors used as switching devices at least one of which is located at every crossing of a gate line with a data line, pixel electrodes connected to the respective thin film transistors wherein each pixel electrode substantially defines the location of a liquid crystal cell, and an alignment film. The gate lines and the data lines receive signals from the driving circuit through suitable contact pads. A scan signal supplied to a gate line turns on the respective thin film transistors to supply the respective pixel electrodes with pixel voltage signals carried by the respective data lines.

The color filter array substrate includes color filters formed to correspond to the liquid crystal cells, a black matrix for reflecting external light and optically separating the color filters from each other, a common electrode for supplying a reference voltage to the liquid crystal cells, and an alignment film.

The thin film transistor array substrate and the color filter array substrate are manufactured separately, and then attached to each other. The liquid crystal material is then injected between the two substrates, and then the edges around the substrates are sealed.

Fabrication of the thin film transistor array substrate involves semiconductor processes and in particular mask processes. Each mask process typically includes a lithographic (selective) exposure of a material sensitive to some radiation, e.g. photolithographic exposure of photoresist using for an optical mask such as a quartz mask with a chrome pattern, or electron beam exposure or some type of exposure. Each mask process further includes cleaning, deposition of photoresist or other sensitive material, stripping of the sensitive material, inspection and the like. The mask processes complicate the manufacturing and are a major factor in the manufacturing cost. Consequently, reducing the number of mask processes is a common goal in manufacturing. Manufacturing processes are known which use five mask processes to manufacture a thin film transistor array substrate. More recently the number of mask processes has been reduced to four.

Further reduction of the number of mask processes is desired.

SUMMARY

This section summarizes some features of some embodiments of the present invention. Other features are described in subsequent sections. The invention is defined by the appended claims.

The inventors have examined utilization of a lift-off process for the purpose of reducing the number of mask processes in manufacturing a thin film transistor array substrate. In particular, the inventors have determined that after forming the thin film transistors, the pixel electrodes can be patterned by a lift-off process using a photoresist pattern formed in the same photoresist layer that was used earlier to pattern a passivation film overlying the transistors. In particular, the photoresist can be formed on the passivation film and photolithographically patterned to have a thicker portion and a thinner portion, with an undercut at the bottom of the thicker portion. The thicker portion defines the pixel electrodes, and more particularly surrounds the pixel electrode regions. The passivation film is then patterned using the thicker and thinner portions as a mask, and then the photoresist is thinned to remove the thinner portion. A conductive film is then formed and patterned by the remaining photoresist in the lift-off process to form the pixel electrodes.

However, in the lift-off process, floating particles of the conductive film contaminate the photoresist stripper solution, the associated filter and other equipment. In addition to damage to the equipment, the contamination of the PR stripper solution acts to decrease the processing speed and hence the productivity.

Some embodiments of the present invention solve or alleviate the above-described problems and provide a simplified thin film transistor array structure and manufacturing process. In particular, some embodiments exploit the uneven topography of the photoresist pattern to form an additional masking pattern over the conductive film without a mask process. The additional masking pattern covers the pixel electrode regions surrounded by the photoresist pattern. The additional masking pattern is used to pattern the conductive film before stripping the photoresist pattern. Therefore, the conductive film is patterned without a lift-off process.

Also, in some embodiments of the present invention the number of mask processes is reduced.

Some embodiments of the present invention provide a method of manufacturing a thin film transistor array substrate, the method comprising: (a) forming a structure comprising: one or more gate lines with a plurality of gate electrodes for an array of thin film transistors; a gate insulating film overlying the gate electrodes and providing gate dielectric for the thin film transistors; a plurality of semiconductor regions over the gate insulating film, the semiconductor regions providing an active region for each thin film transistor; one or more data lines; for each thin film transistor, source/drain electrodes which partially overlie the thin film transistor's active region, wherein one of the source/drain electrodes of each thin film transistor is connected to a respective data line; (b) forming a passivation film over the source/drain electrodes; (c) forming a first photoresist pattern of a first photoresist over the passivation film, the first photoresist pattern comprising a first portion partially overlying at least one source/drain electrode of each thin film transistor and overlying each of a plurality of pixel electrode regions each of which is a region to be occupied by a pixel electrode, the first photoresist pattern comprising a second portion thicker than the first portion; (d) patterning the passivation film using the first photoresist pattern as a mask; (e) removing the first portion of the first photoresist pattern to form a second photoresist pattern of the first photoresist, the second photoresist portion forming protrusions around the pixel electrode regions; (f) forming a transparent conductive film overlying the second photoresist pattern and being recessed over each pixel electrode region; (g) forming a masking pattern over the transparent conductive film in each pixel electrode region, the masking pattern's top surface being below a top of the transparent conductive film over the second photoresist pattern; (h) patterning the transparent conductive film using the masking pattern as a mask to form each said pixel electrode; and (i) removing the masking pattern.

In some embodiments, forming said structure comprises: depositing the gate insulating film, then an intrinsic amorphous silicon film, then an n+ amorphous silicon film, and then a data conductor film; forming a third photoresist pattern over the data conductor film, wherein the third photoresist pattern comprises a third portion over a channel region of each thin film transistor and a fourth portion over the source/drain electrodes, the fourth portion being thicker than the third portion; etching the data conductor film, then the n+ amorphous silicon film, and then the intrinsic silicon film using the third photoresist pattern as a mask to form the one or more data lines, an n+ semiconductor pattern, and an intrinsic semiconductor pattern; removing the third portion of the third photoresist pattern to transform the third photoresist pattern into a fourth photoresist pattern; and etching the data conductor film and the n+ semiconductor film using the fourth photoresist pattern as a mask to form the source/drain electrodes and ohmic contacts which underlie and contact the source and drain electrodes and which overlie and contact the thin film transistors' active regions.

Some embodiments further comprise forming a storage electrode line of the same material and film as the one or more gate lines, wherein the storage electrode line runs parallel with the one or more gate lines.

In some embodiments, the masking pattern is formed from a layer deposited by spin coating, slit coating, or inkjet printing.

In some embodiments, the masking pattern is formed without a mask process.

In some embodiments, the masking pattern is not defined by selective deposition of any material and is not defined by selective removal of any material.

In some embodiments, the masking pattern is defined by the second photoresist pattern.

In some embodiments, each pixel electrode overlies the gate insulating film.

BRIEF DESCRIPTION OF THE DRAWINGS

FIGS. 8A-8G illustrate vertical cross sections, along the line VIII-VIII' in FIG. 7, of the thin film transistor array substrate in the process of fabrication.

DESCRIPTION OF SOME EMBODIMENTS

Exemplary embodiments of the present invention will now be described in detail with reference to FIGS. 1 to 8G.

Figure 1:
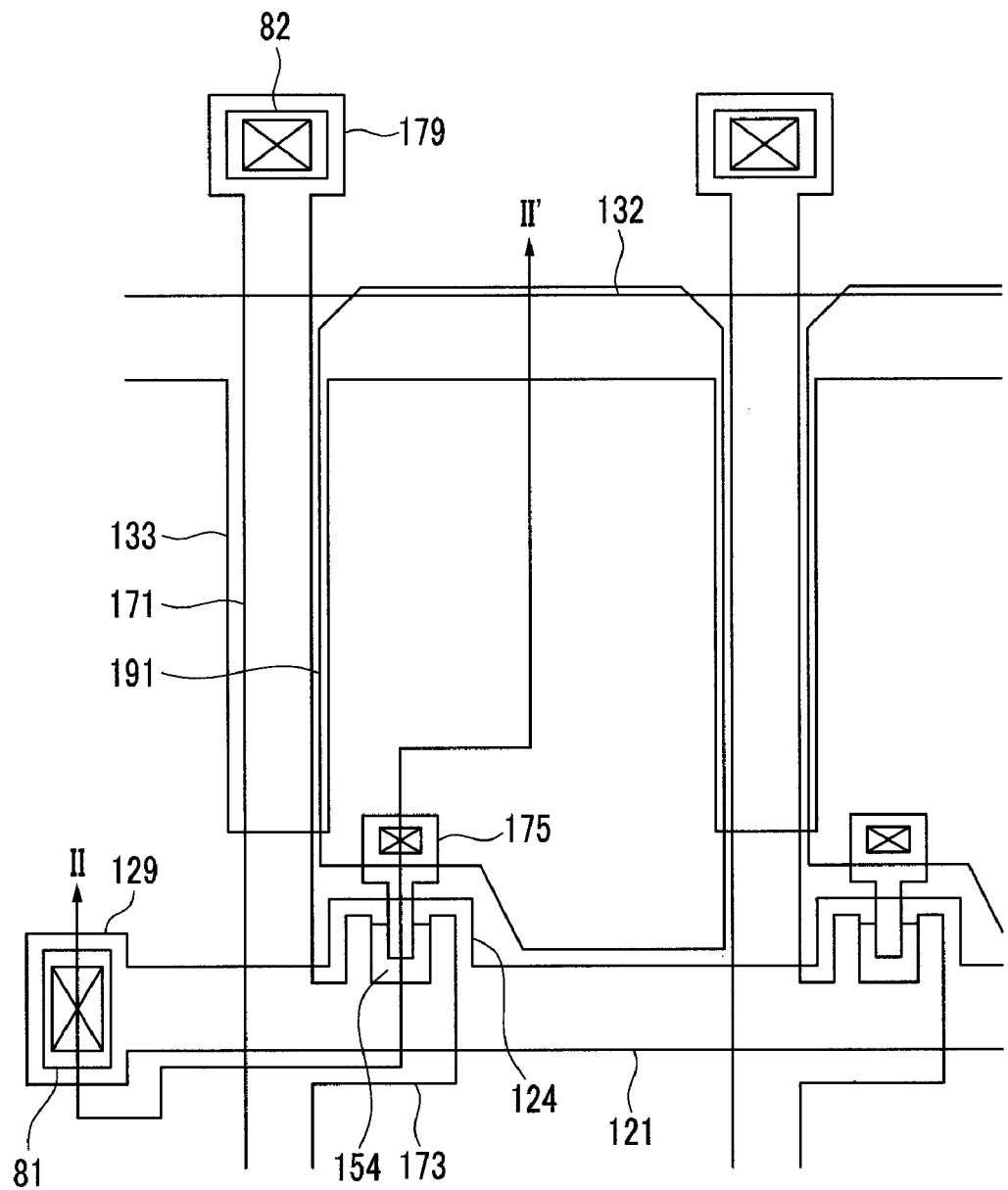
FIG. 1 is a plan view illustrating a thin film transistor array substrate according to an embodiment of the present invention.
Figure 2:
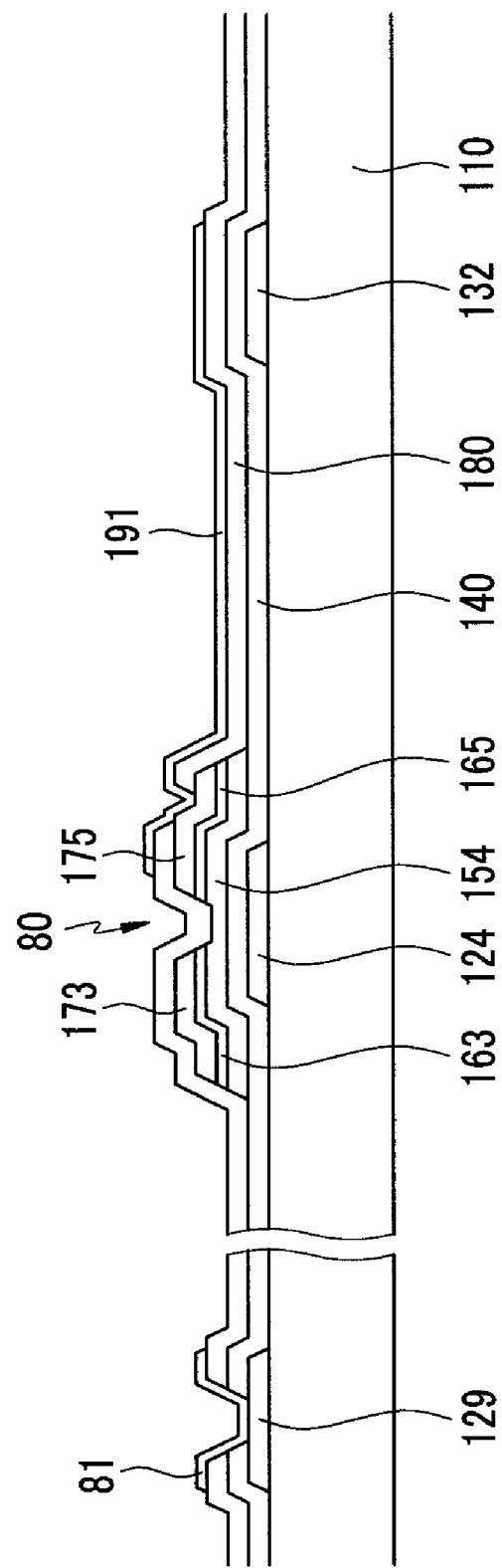
FIG. 2 illustrates a vertical cross section of the thin film transistor array substrate taken along the line II-II' in FIG. 1.

FIG. 1 is a plan view showing a thin film transistor array substrate according to an exemplary embodiment of the present invention, and FIG. 2 illustrates a vertical cross section of the thin film transistor array substrate taken along the line II-II' in FIG. 1.

Referring to FIGS. 1 and 2, the thin film transistor array substrate includes one or more gate lines 121 separated from one or more data lines 171 by a gate insulating pattern 140. The thin film transistor array substrate also includes storage electrode lines 132 running parallel to the gate lines 121. One storage electrode line 132 is provided for each gate line 121. The gate lines, the data lines, the storage electrode lines, and the gate insulating pattern may be formed on a substrate 110. The gate lines 121 cross with the data lines 171, with a thin film transistor 80 formed at each crossing, and a pixel electrode 191 formed in a cell region defined at the crossing. Each pixel electrode 191 overlaps with the adjacent storage electrode line 132 and with two storage electrodes 133 extending from the storage line 132 over the date lines 171 adjacent to the pixel electrode. The drawings contain numerals 81 and 82, but these numerals are not defined in the specification.

Each thin film transistor includes a gate electrode 124 connected to the respective gate line 121, a source electrode 173 connected to the respective data line 171, a drain electrode 175 connected to the respective pixel electrode 191, and a semiconductor pattern including a first active region 154 overlying the gate electrode 124. The semiconductor pattern is separated from the gate electrode 124 by the first gate insulating pattern 140 and the second gate insulating pattern. The transistor channel is formed in the first active region 154 between the source electrode 173 and the drain electrode 175. In response to a gate signal supplied to the respective gate line 121, the thin film transistor transfers a pixel voltage signal from the respective data line 171 to the respective pixel electrode 191 for storage at the pixel electrode.

In each thin film transistor, the first active region 154 of the semiconductor pattern overlies the gate electrode 124 and is separated from the gate electrode by the first gate insulating pattern 140 and the second gate insulating pattern. The thin film transistor's channel is provided by a portion of the first active region 154 between the respective source electrode 173 and the respective drain electrode 175. The semiconductor pattern also includes a second active region overlapping with the respective storage electrodes 133. And the semiconductor pattern may further include an ohmic contact film with ohmic contact regions 163, 165 formed on the first and second active regions 154 for providing ohmic contact to the data lines 171, the source electrodes 173, and the drain electrodes 175.

A passivation film 180 overlies the thin film transistors. Pixel electrodes 191 overlie the passivation film 180. Each pixel electrode 191 contacts the respective transistor's drain electrode 175 through a respective opening in the passivation film 180. In operation, each pixel electrode 191 is driven with a pixel voltage to obtain a desired voltage difference between the pixel electrode 191 and a common electrode (not shown) formed in an upper substrate (e.g. color filter substrate, not shown). Due to the dielectric anisotropy of the liquid crystal material located between the thin film transistor substrate and the upper substrate, the voltage between the pixel electrode and the common electrode affects the rotational orientation of the liquid crystal molecules. The rotational orientation of the LC molecules affects transmission of light travelling through the pixel electrode 191 toward the upper substrate when light is emitted from a light source (not shown).

In each pixel, the pixel electrode 191 occupies substantially the same area as the passivation film 180. This geometry is due to a process in which the pixel electrode 191 is patterned using a photoresist pattern that is initially used to pattern the passivation film 180.

The height difference between the pixel electrode regions (i.e. the regions occupied by the pixel electrodes) and the storage electrode regions (the regions occupied by the storage electrodes 133) is small due to the first gate insulating film 140 being left in the pixel electrode regions. This is advantageous for the alignment layer formation. More particularly, in some embodiments, the alignment layer (not shown) is deposited over the pixel electrodes and is rubbed to provide a preferred orientation to the liquid crystal molecules. The liquid crystal is deposited on the alignment layer. The small difference in height is advantageous to reduce the rubbing defects which may occur in the rubbing process. Also, the cell gap is more uniform due to the reduced difference in height.

The thin film transistor array substrate having the above-mentioned configuration can be manufactured using three mask processes. In particular, in some embodiments, a first mask process is used for patterning the gate lines 121; a second mask process is used for forming the semiconductor patterns and the source/drain patterns 173, 175; and a third mask process is used for patterning the passivation film 180 and the transparent electrodes 191.

FIGS. 3 to 8G show plan views and vertical cross sections at consecutive stages of manufacturing the thin film transistor array substrate according to an exemplary embodiment of the present invention.

Figure 3:
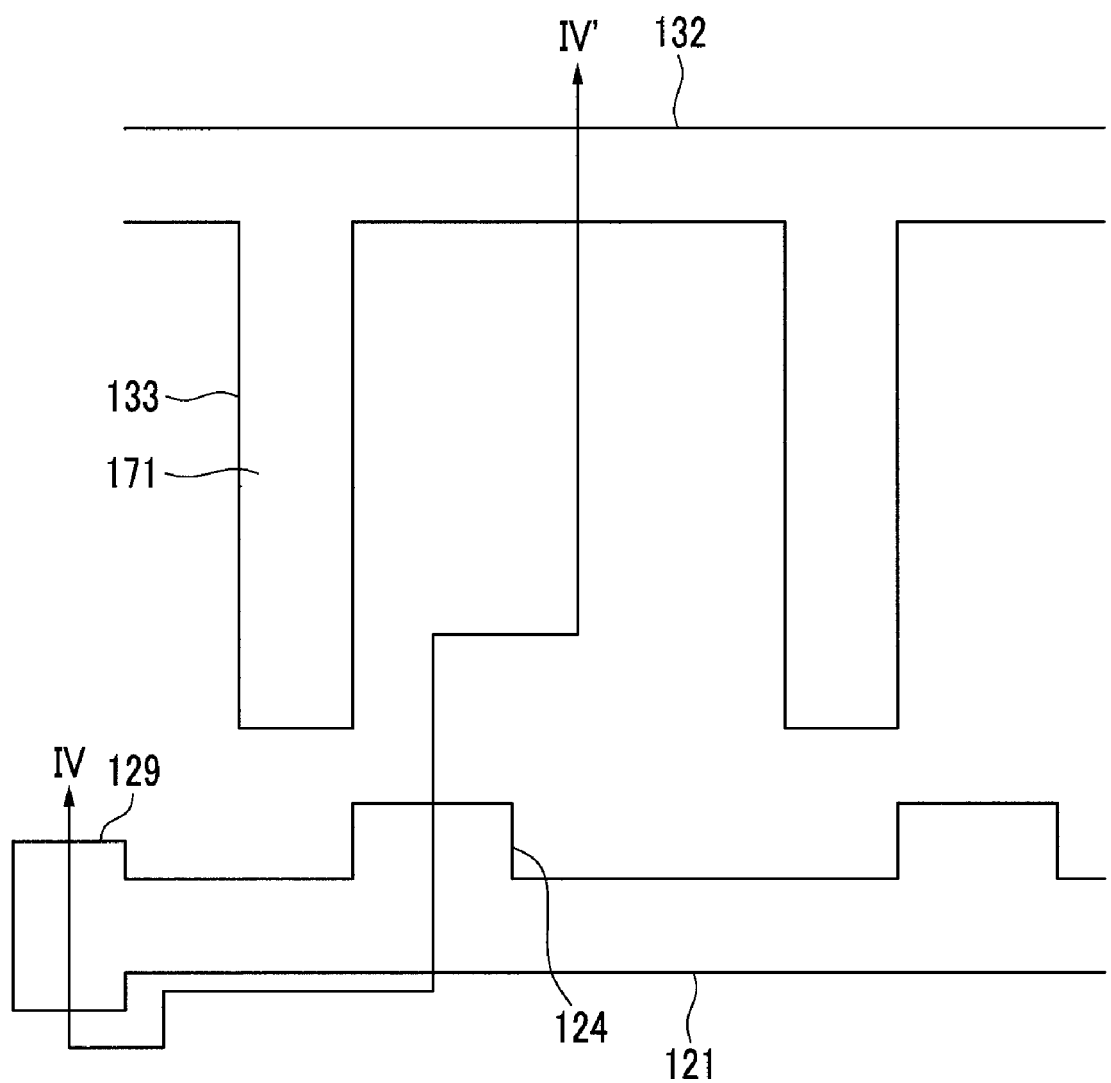
FIG. 3 is a plan view illustrating a thin film transistor array substrate according to an embodiment of the present invention in the process of fabrication.
Figure 4:
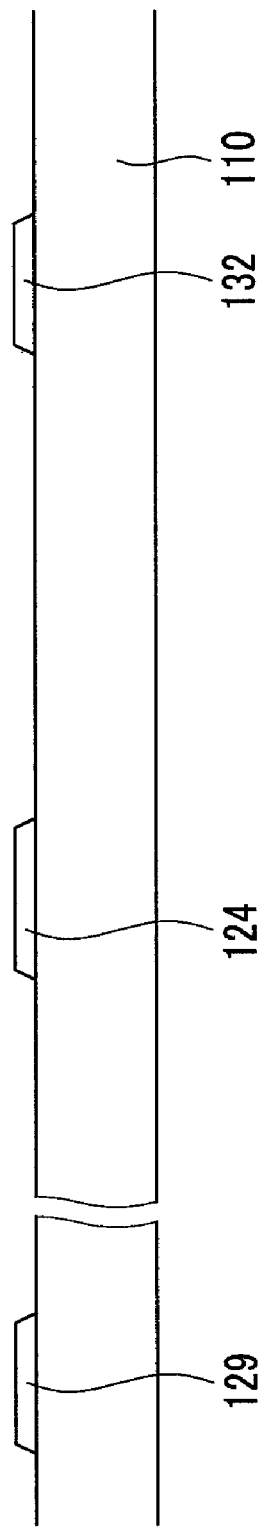
FIG. 4 illustrates a vertical cross section, along the line IV-IV' in FIG. 3, of the thin film transistor array substrate in the process of fabrication.

FIGS. 3 and 4 are a plan view and a sectional view, respectively, illustrating the gate pattern formed on the lower substrate 110 by the first mask process.

The gate pattern is formed from a metal film ("gate metal film") that can be deposited on the substrate 110 by a method such as sputtering. Subsequently, the gate metal film may be patterned in the first mask process using a first photoresist mask (not shown) formed by a photolithography process using a first optical mask (not shown, e.g. a quartz mask with a chrome pattern). The gate metal film is etched selectively to the first photoresist mask to form the gate pattern including (i) the gate lines 121 with their respective widened ends 129, (ii) the gate electrodes 124, (iii) the storage electrode lines 132 and (iv) the storage electrodes 133. The gate metal may be Cr, MoW, Cr/Al, Cu, Al(Nd), Mo/Al, Mo/Al(Nd), Cr/Al(Nd) and the like. The gate metal film may be a single layer structure or a double layer structure.

Figure 5:
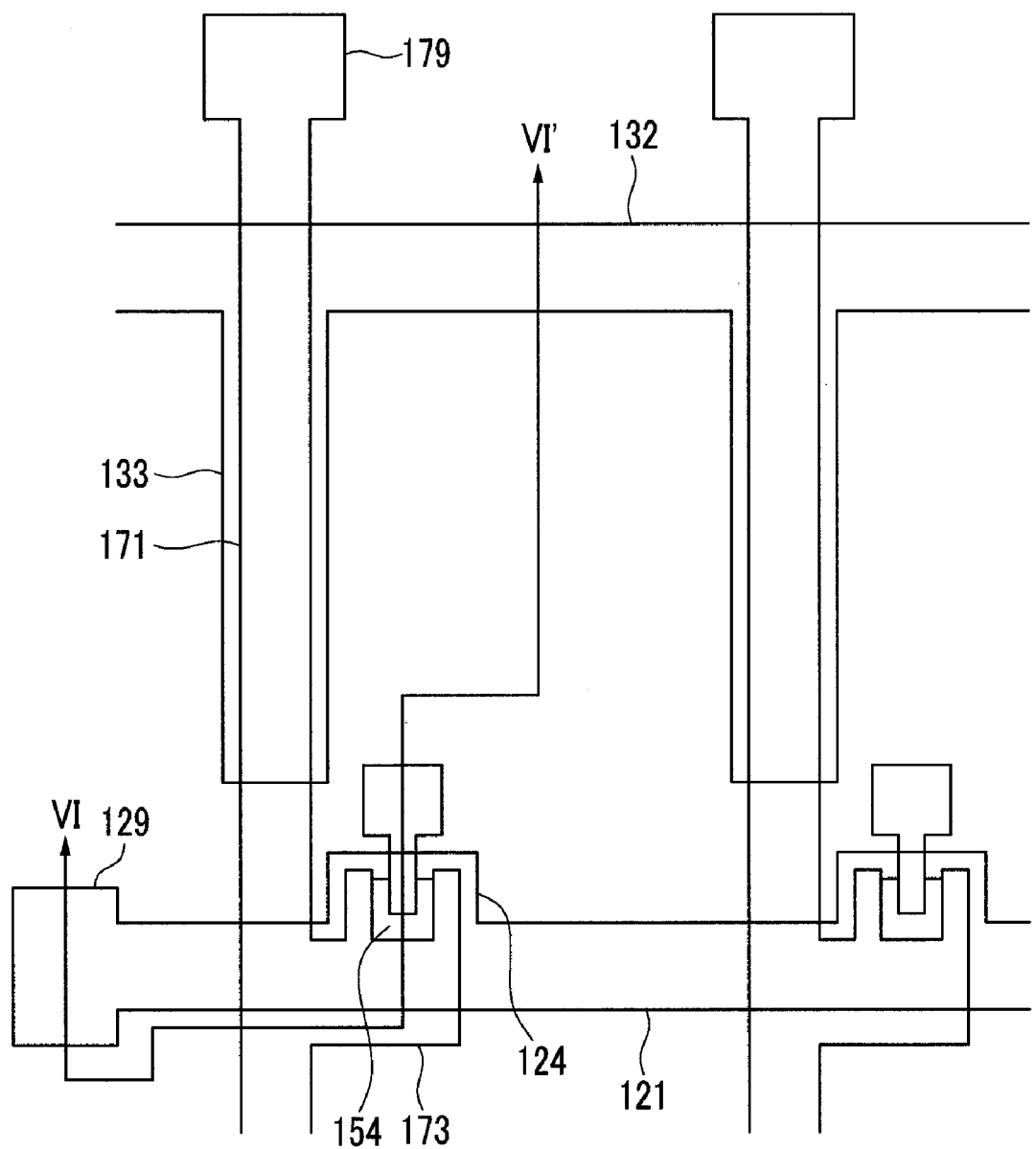
FIG. 5 is a plan view illustrating a thin film transistor array substrate according to an embodiment of the present invention in the process of fabrication.
Figure 6A:
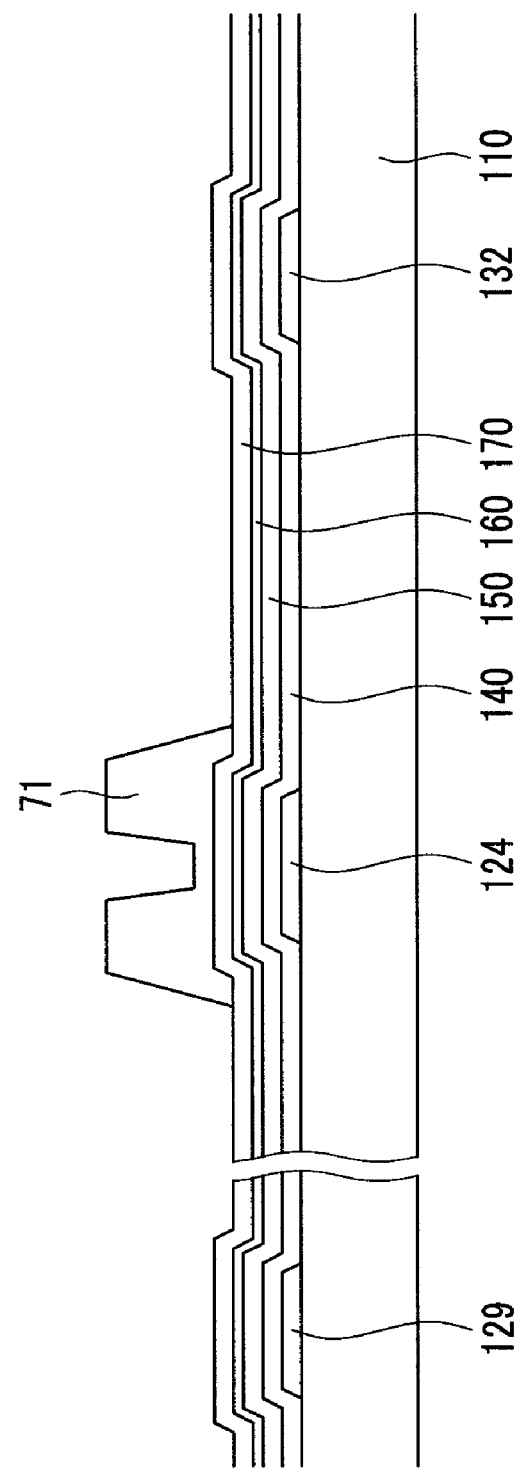
FIGS. 6A, 6B illustrate vertical cross sections, along the line VI-VI' in FIG. 5, of the thin film transistor array substrate in the process of fabrication.
Figure 6B:
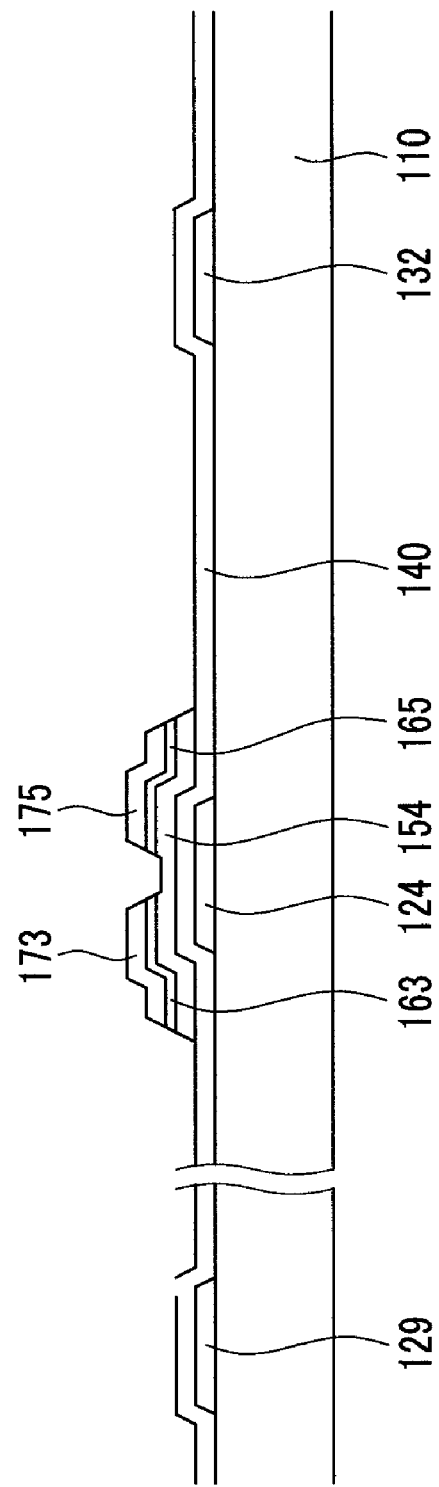

The second mask process is illustrated in FIG. 5 (plan view) and FIGS. 6A and 6B (vertical cross sections). The second mask process is used to form the source/drain patterns and the semiconductor patterns.

More particularly, the gate insulating film 140, an amorphous silicon film 150, an n+amorphous silicon ohmic contact film 160, and a data metal film 170 are formed on the substrate 110, in that sequence, over the gate pattern by deposition techniques such as plasma enhanced chemical vapor deposition (PECVD) and sputtering. The gate insulating film 140 may be made of an inorganic insulation material such as silicon nitride (SiNx). The data metal film 170 may be made of molybdenum (Mo), titanium (Ti), tantalum (Ta) or a molybdenum alloy.

Then, in the second mask process, a photoresist pattern 71 is formed of photoresist on the data metal film 170 by a photolithography process as illustrated in FIG. 6A. The photoresist exposure is done through a second optical mask, which can be a diffractive exposure mask having a diffractive exposing part at a channel portion of each thin film transistor, thereby allowing the photoresist pattern 71 to be thinner over the channels than over the source/drain regions 173, 175 as shown in FIG. 6B.

Subsequently (FIG. 6B), the data metal film 170 may be patterned by a wet etching process, with the photoresist pattern 71 as a mask, to form the data lines 171, the source electrodes 173, the drain electrodes 175 (which at this point are connected to the respective source electrodes 173), and the data lines' widened ends 179.

Using the same photoresist pattern 71, the amorphous silicon film 150 and the n+ amorphous silicon film 160 may be patterned in a single dry etching process to form the ohmic contact features 163, 165 and the first active regions 154. Next, the photoresist 71 may thinned by ashing to remove the thinner photoresist portions over the channel regions. Thereafter, the data metal film 170 exposed by the photoresist 71 in the channel areas is etched away, by a dry etch for example, to finish formation of the source electrodes 173 and the drain electrodes 175 and in particular to separate the source and drain electrodes of each thin film transistor from each other. The ohmic contact film 160 becomes exposed over the channel regions, and can be removed over the channel regions (by a dry etching process for example) to expose the first active regions 154 in the channel regions and to be removed between the source electrodes 173 and the respective drain electrodes 175, as shown in FIG. 6B.

Thereafter, the remainder of the photoresist pattern 71 can be stripped away.

Figure 7:
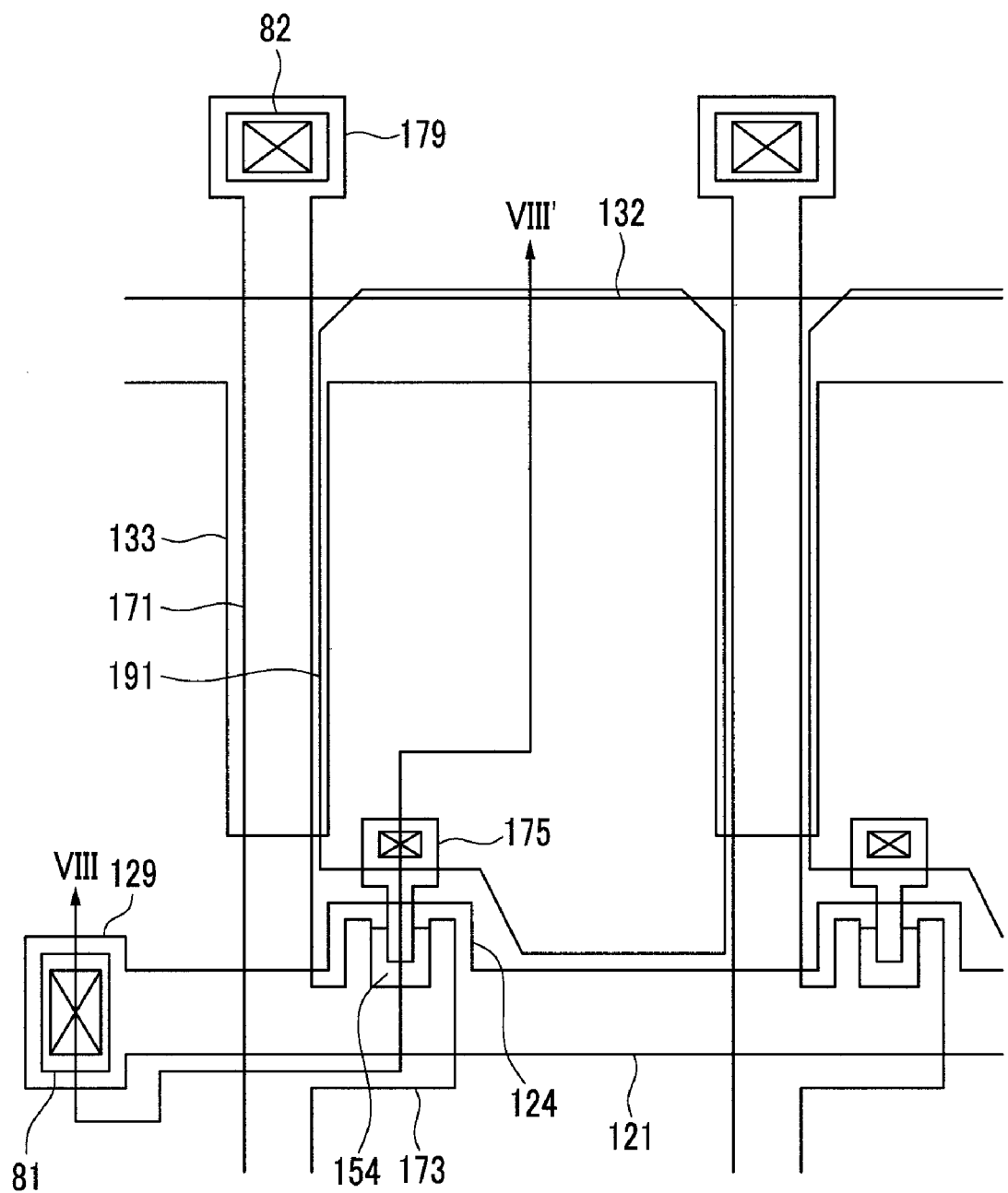
FIG. 7 is a plan view illustrating a thin film transistor array substrate according to an embodiment of the present invention in the process of fabrication.
Figure 8A:
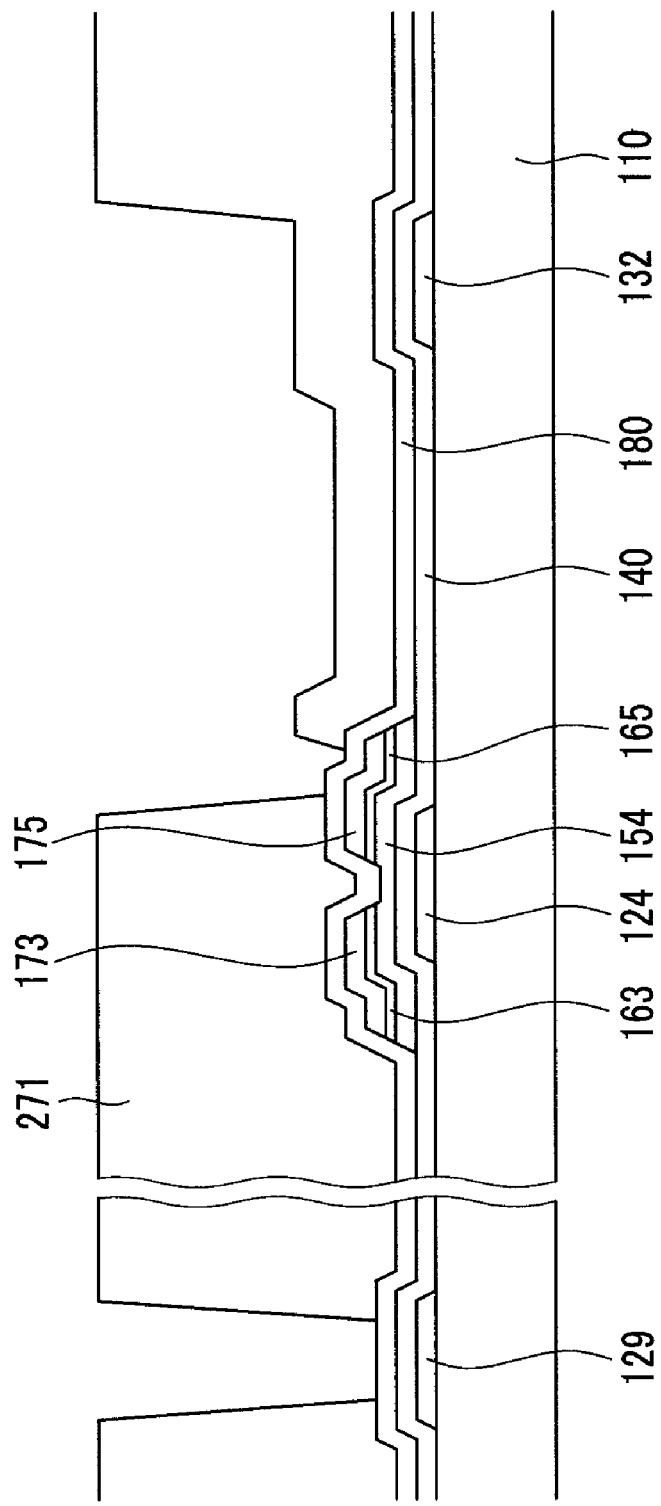
Figure 8B:
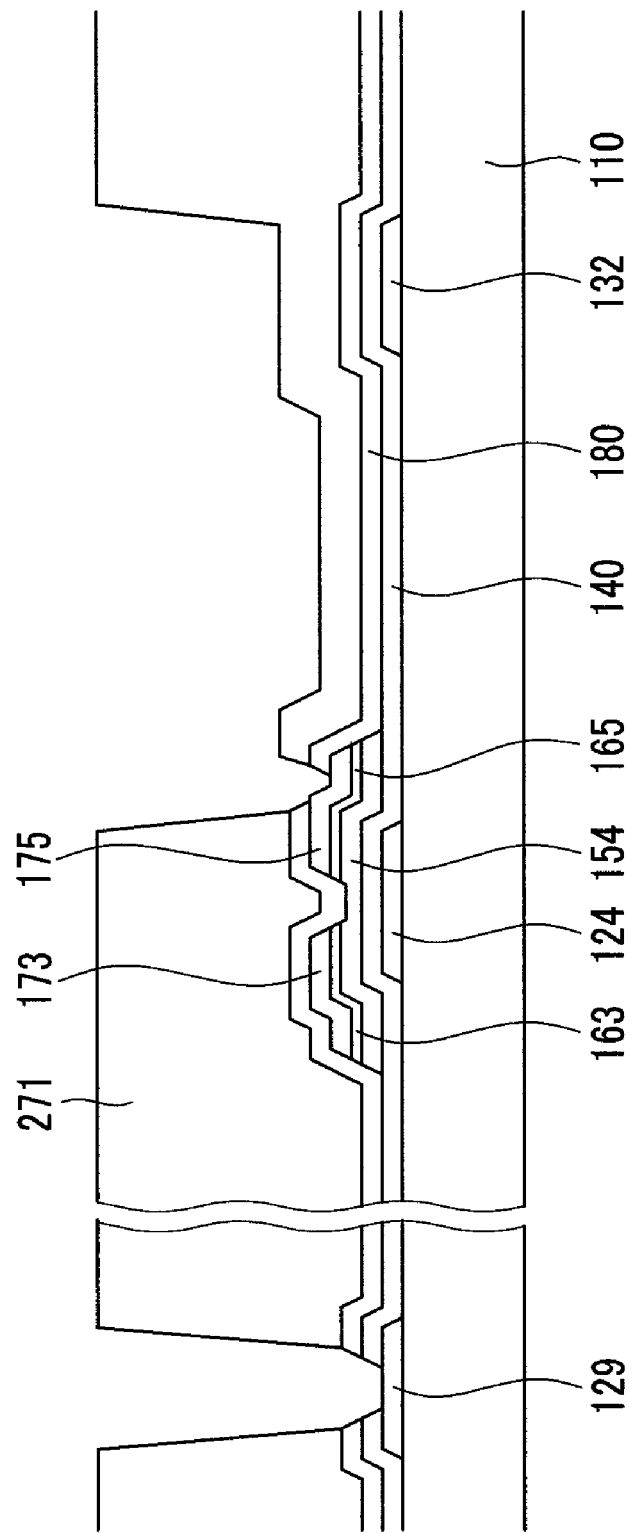
Figure 8C:
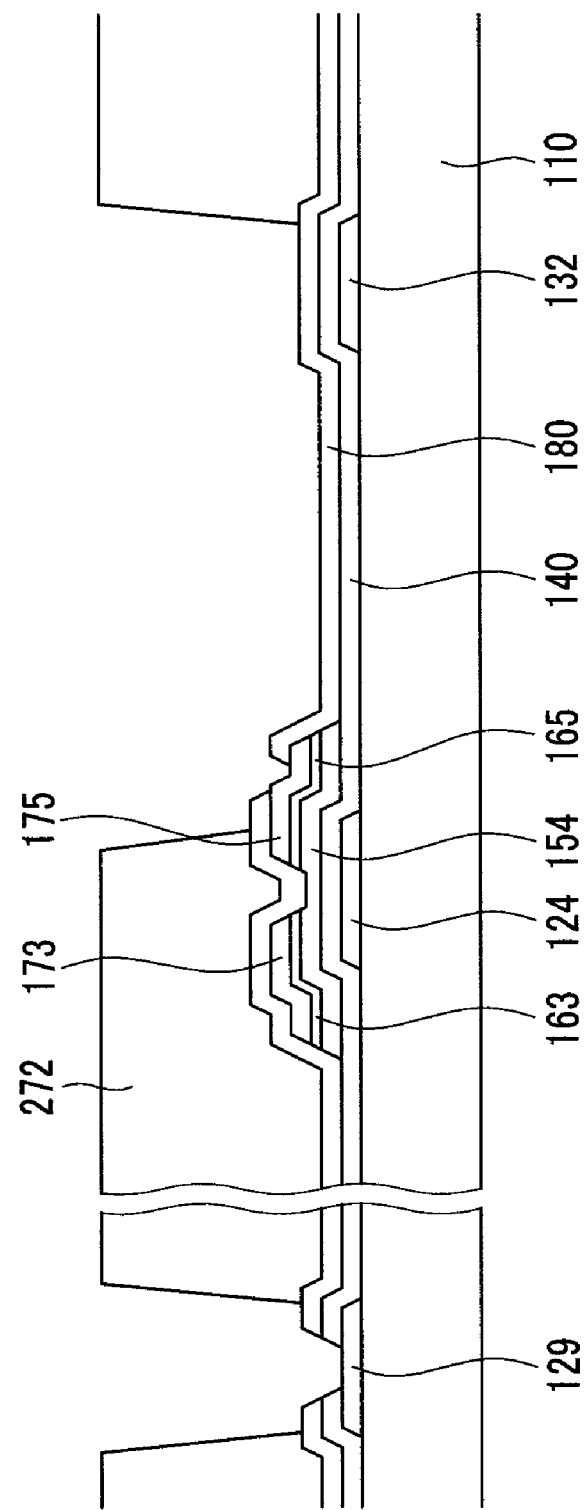
Figure 8D:
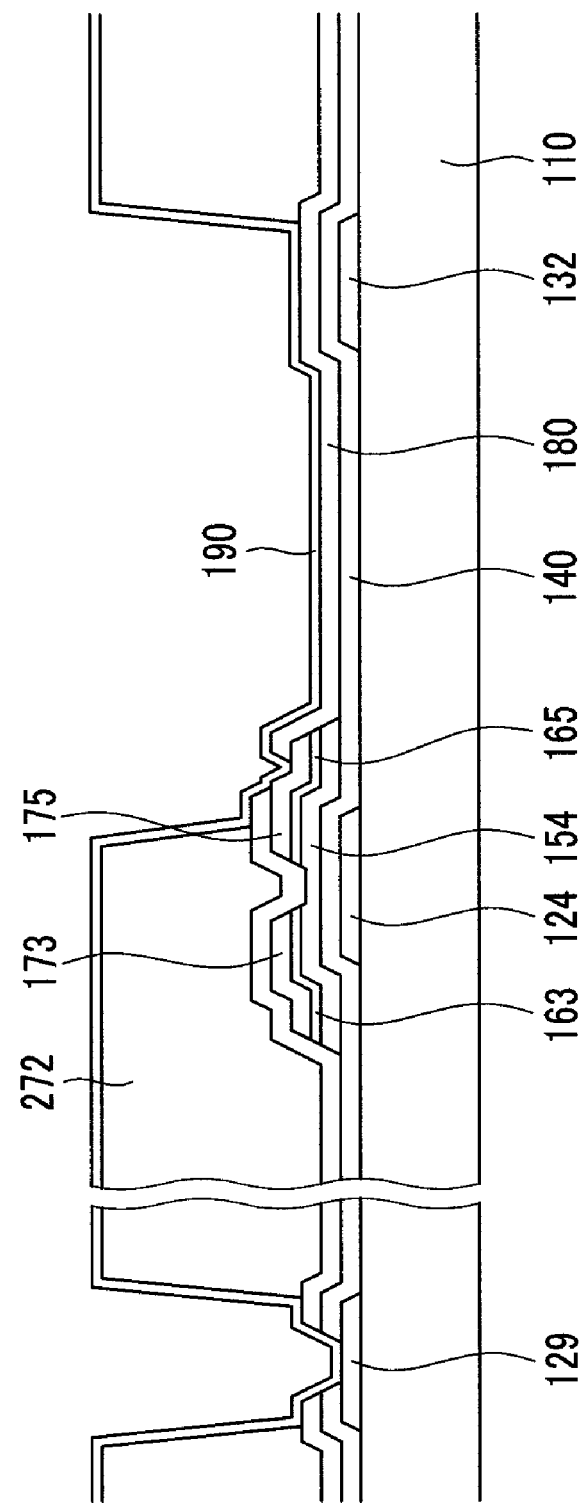
Figure 8E:
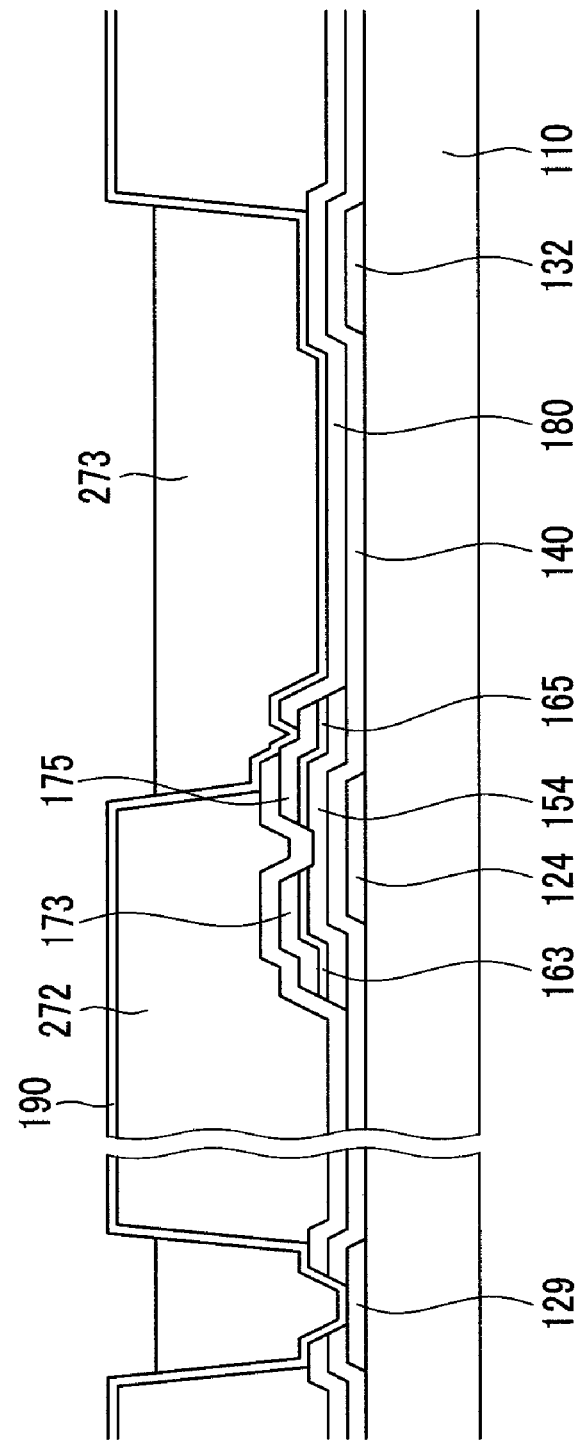

FIG. 7 (plan view) and FIGS. 8A to 8G (showing vertical cross sections) illustrate the third mask process. More particularly, the passivation film 180 is deposited over the gate insulating film 140 and the source and drain electrodes. The passivation film 180 may include an inorganic insulating material such as silicon oxide (SiOx) and/or silicon nitride (SiNx) or an organic insulating material having a small dielectric constant such as an acrylic organic compound, BCB (benzocyclobutene), PFCB (perfluorocyclobutane) or the like. And the laminated structure including inorganic insulating layer is possible. The passivation film 180 may be deposited by a technique such as plasma enhanced chemical vapor deposition (PECVD). The passivation film 180 is then covered by photoresist. The photoresist is patterned by a photolithography process using a third optical mask (not shown) to form a photoresist pattern 271 as shown in FIG. 8A. The photoresist pattern 271 includes (i) a first, thinner portion overlying parts of the drain electrodes 175 and overlying the pixel electrode regions (the regions to be occupied by the pixel electrodes 191 as shown in FIG. 1; the pixel electrodes have not yet been formed), (ii) a second portion overlying the source electrodes 173, the data lines 171, and the channel regions, and (iii) a third portion partially overlying and partially exposing the gate lines' widened ends 129 and the data lines widened ends 179. The photoresist pattern 271 is thinner at the first portion than at the second and third portions. The photoresist pattern 271 can later be removed by an ashing process.

Subsequently (FIG. 8B), the passivation film 180 may be patterned by dry etching using the photoresist pattern 271 as a mask. This process exposes the drain electrodes 175 and removes the gate insulating film 140 and the passivation film 180 in those areas of the gate lines' widened ends 129 and the data lines' widened ends 179 which are not covered by the photoresist 271.

Next (FIG. 8C), the photoresist pattern 271 is thinned by a blanket etch to remove the first portion of the photoresist pattern. In particular, the photoresist pattern 271 is removed from over parts of the drain electrodes 175 and over the pixel electrode regions. The etch can be dry ashing using oxygen plasma. The remaining photoresist is shown at 272.

Next (FIG. 8D), a transparent conductive film 190 may be deposited over the entire substrate 110 over the photoresist pattern 272 by a method such as sputtering. The transparent conductive film 190 may be made of indium-tin-oxide (ITO), tin-oxide (TO) or indium-zinc-oxide (IZO). Due to upward protrusions formed by the photoresist pattern 272 around the pixel electrode regions, the transparent conductive film 190 is recessed in each pixel electrode region.

Next (FIG. 8E), another photoresist layer 273 may be deposited over the entire substrate 110 over the transparent conductive film 190. The photoresist layer 273 will later be used as a masking pattern to selectively etch the transparent conductive film 190. The photoresist layer 273 can be patterned without an optical mask and without any mask process. The photoresist layer 273 can be patterned by controlling its thickness so as to take advantage of the protrusions formed by the photoresist pattern 272 around the pixel electrode regions. More particularly, the photoresist layer 273 can be deposited to have a substantially planar top surface below the top of the transparent conductive film 190 over the photoresist pattern 272. However, even if the photoresist layer 273 is deposited to such thickness, some of the photoresist layer 273 may be present over the photoresist pattern 272 because the photoresist material provides good step coverage. Therefore, the photoresist layer 273 can be blanket-etched after the deposition by a dry ashing technique using oxygen plasma to remove the photoresist layer 273 from over the photoresist pattern 272.

The photoresist layer 273 should preferably have a planar top surface. In some embodiments, the photoresist layer 273 is deposited by spin coating, slit coating, or inkjet printing. In a spin coating process, the photoresist material is dropped on a substrate which is spinning at a high angular speed. The centrifugal effect causes the photoresist material to spread uniformly over the whole surface of the substrate. A uniform coating is obtained thereby. Alternatively, a slit coating process can be used. In the slit coating process, the photoresist material is injected onto the substrate through a slit-shaped coater whose length is much greater than the width. The substrate is coated with the photoresist material as the coater repeatedly moves over the substrate along a latitudinal direction of the coater. In the inkjet printing method, an organic solution drips through openings defined by a plurality of partitions to form an organic thin film of photoresist.

The photoresist layer 273 provides a masking pattern that is not defined by a mask process but is defined by the upward protrusions formed by the photoresist pattern 272. Therefore, the layer 273 can be formed from a non-photosensitive material. For example, a non-photosensitive flowable material can be flown onto the structure (e.g. by spin coating, slit coating, ink jet printing) to provide a planar top surface below the top of the transparent conductive film 190. Further, the material does not have to be flowable. The material may be deposited over the whole structure to have a planar top surface, or at least to be thinner over the pixel electrode regions than over the upward protrusions of the photoresist pattern 272. The material can then be blanket-etched until the transparent conductive film 190 is exposed over the upward protrusions of the photoresist pattern 272.

Figure 8F:
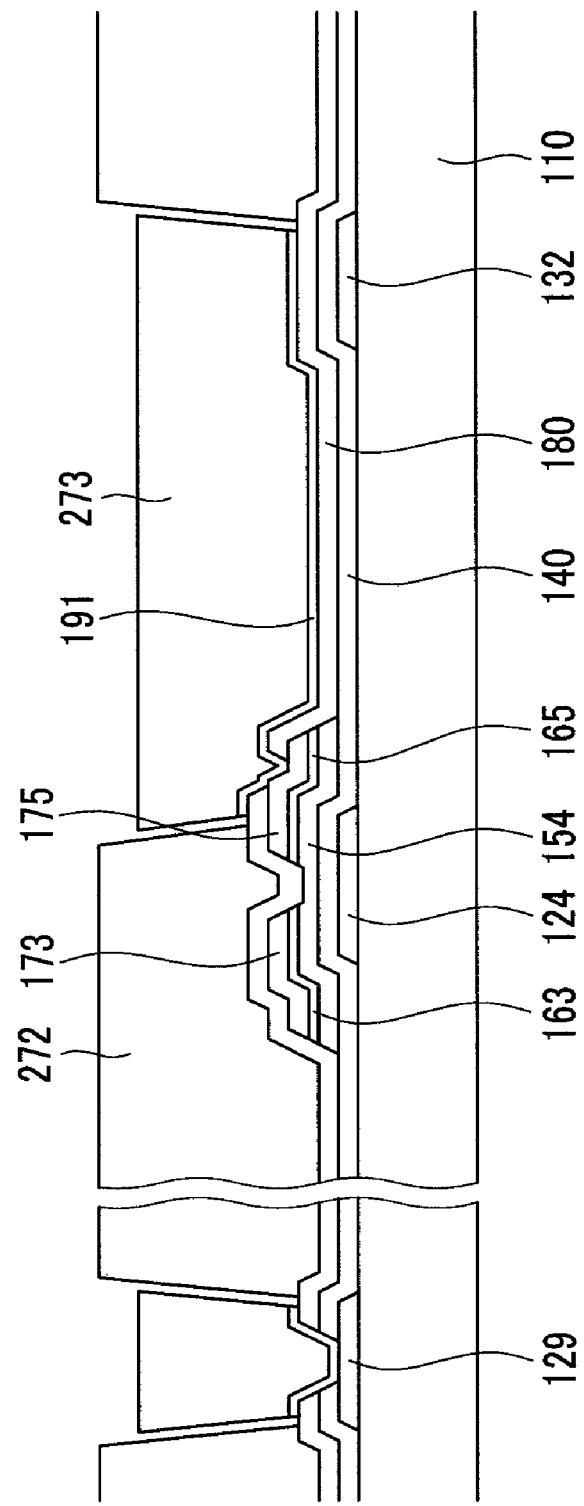

Next (FIG. 8F), the transparent conductive film 190 may be etched using the masking pattern 273 as an etch mask to provide the pixel electrodes 191. A wet etch may be used. The etch may remove the transparent conductive film 190 both between the layers 272, 273 and over the photoresist layer 272. The transparent conductive film 190 remains over portions of the drain electrodes 175 so that each pixel electrode 191 physically contacts the respective drain electrode 175 through the respective opening in the passivation film 180. The transparent conductive film 190 also remains over the gate lines' widened ends 129 and the data lines' widened ends 179 and contacts the widened ends 129, 179. The transparent conductive film 190 remains underneath the photoresist 273 to provide the pixel electrodes 191. As a result, a TFT panel structure is formed as shown in FIG. 8F.

The layers 272, 273 may then be removed by a stripping process. The remaining portions of the conductive film 190 provide the pixel electrodes 191.

As described above, use of only three mask processes with an additional masking pattern formed without a mask process can simplify the manufacturing of the thin film transistor array substrate and can also provide a simpler configuration of the substrate. Accordingly, it may be possible to decrease manufacturing costs and increase manufacturing yield.

Further, in the embodiments described above, leaving the gate insulating film 140 below the pixel electrodes 191 reduces the height difference and the number of the associated defects.

The embodiments described above illustrate but do not limit the invention. Other embodiments and variations are within the scope of the invention as defined by the appended claims.

What is claimed is:
1. A method of manufacturing a thin film transistor array substrate, the method comprising:
   (a) forming a structure comprising:
   one or more gate lines with a plurality of gate electrodes for an array of thin film transistors;
   a gate insulating film overlying the gate electrodes and providing gate dielectric for the thin film transistors;
   a plurality of semiconductor regions over the gate insulating film, the semiconductor regions providing an active region for each thin film transistor;
   one or more data lines;
   for each thin film transistor, source/drain electrodes which partially overlie the thin film transistor's active region, wherein one of the source/drain electrodes of each thin film transistor is connected to a respective data line;
   (b) forming a passivation film over the source/drain electrodes;
   (c) forming a first photoresist pattern of a first photoresist over the passivation film, the first photoresist pattern comprising a first portion partially overlying at least one source/drain electrode of each thin film transistor and overlying each of a plurality of pixel electrode regions each of which is a region to be occupied by a pixel electrode, the first photoresist pattern comprising a second portion thicker than the first portion;

(d) patterning the passivation film using the first photoresist pattern as a mask;

(e) removing the first portion of the first photoresist pattern to form a second photoresist pattern of the first photoresist, the second photoresist portion forming protrusions around the pixel electrode regions;

(f) forming a transparent conductive overlying the second photoresist pattern and being recessed in each pixel electrode region;

(g) forming a masking pattern over the transparent conductive film in each pixel electrode region, the masking pattern's top surface being below a top of the transparent conductive film over the second photoresist pattern;

(h) patterning the transparent conductive film using the masking pattern as a mask to form each said pixel electrode; and (i) removing the masking pattern.

2. The method of claim 1, wherein forming said structure comprises:

depositing the gate insulating film, then an intrinsic amorphous silicon film, then an n+ amorphous silicon film, and then a data conductor film;

forming a third photoresist pattern over the data conductor film, wherein the third photoresist pattern comprises a third portion over a channel region of each thin film transistor and a fourth portion over the source/drain electrodes, the fourth portion being thicker than the third portion;

etching the data conductor film, then the n+ amorphous silicon film, and then the intrinsic silicon film using the third photoresist pattern as a mask to form the one or more data lines, an n+ semiconductor pattern, and an intrinsic semiconductor pattern;

removing the third portion of the third photoresist pattern to transform the third photoresist pattern into a fourth photoresist pattern; and etching the data conductor film and the n+ semiconductor film using the fourth photoresist pattern as a mask to form the source/drain electrodes and ohmic contacts which underlie and contact the source and drain electrodes and which overlie and contact the thin film transistors' active regions.

3. The method according to claim 2, further comprising forming a storage electrode line of the same material and film as the one or more gate lines, wherein the storage electrode line runs parallel with the one or more gate lines.

4. The method according to claim 3, wherein the masking pattern is formed from a layer deposited by spin coating, slit coating, or inkjet printing.

5. The method according to claim 4, wherein the passivation film comprises a first passivation layer and a second passivation layer.

6. The method according to claim 2, wherein the masking pattern is formed from a layer deposited by spin coating, slit coating, or inkjet printing.

7. The method according to claim 6, wherein the passivation film comprises a first passivation layer and a second passivation layer.

8. The method according to claim 1, further comprising forming a storage electrode line of the same material and film as the one or more gate lines, wherein the storage electrode line runs parallel with the one or more gate lines.

9. The method according to claim 8, wherein the masking pattern is formed from a layer deposited by spin coating, slit coating, or inkjet printing.

10. The method according to claim 9, wherein the passivation film comprises a first passivation layer and a second passivation layer.

11. The method according to claim 8, wherein the passivation film comprises a first passivation layer and a second passivation layer.

12. The method according to claim 1, wherein the masking pattern is formed from a layer deposited by spin coating, slit coating, or inkjet printing.

13. The method according to claim 12, wherein the passivation film comprises a first passivation layer and a second passivation layer.

14. The method according to claim 1 wherein the masking pattern is formed without a mask process.

15. The method according to claim 1 wherein the masking pattern is not defined by selective deposition of any material and is not defined by selective removal of any material.

16. The method of claim 1 wherein the masking pattern is defined by the second photoresist pattern.

17. The method according to claim 1 wherein each pixel electrode overlies the gate insulating film.

* * * * *